(12) United States Patent
Yamada et al.

(10) Patent No.: US 11,765,874 B2
(45) Date of Patent: Sep. 19, 2023

(54) METAL MAGNETIC FILM AND MAGNETIC SHEET

(71) Applicant: TDK CORPORATION, Tokyo (JP)

(72) Inventors: Takashi Yamada, Tokyo (JP); Miyuki Yanagida, Tokyo (JP); Atsushi Sato, Tokyo (JP); Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 509 days.

(21) Appl. No.: 16/932,046

(22) Filed: Jul. 17, 2020

(65) Prior Publication Data

US 2020/0352061 A1    Nov. 5, 2020

Related U.S. Application Data

(63) Continuation of application No. 16/144,604, filed on Sep. 27, 2018, now abandoned.

(51) Int. Cl.
  C25D 3/56    (2006.01)
  H05K 9/00    (2006.01)
  C25D 7/00    (2006.01)

(52) U.S. Cl.
  CPC .......... *H05K 9/0083* (2013.01); *C25D 3/562* (2013.01); *H05K 9/0088* (2013.01); *C25D 7/001* (2013.01)

(58) Field of Classification Search
  None
  See application file for complete search history.

(56) References Cited

U.S. PATENT DOCUMENTS

| | | | |
|---|---|---|---|
| 6,337,007 B1 * | 1/2002 | Osaka | C25D 3/562 205/255 |
| 2003/0010408 A1 | 1/2003 | Hosoe et al. | |
| 2006/0083948 A1 | 4/2006 | Kawaguchi et al. | |
| 2008/0257599 A1 | 10/2008 | Matsushita et al. | |
| 2010/0098576 A1 | 4/2010 | Yoshizawa et al. | |

FOREIGN PATENT DOCUMENTS

| | | |
|---|---|---|
| CN | 86106937 A | 4/1988 |
| CN | 101032198 A | 9/2007 |
| CN | 101492794 A | 7/2009 |
| JP | 2002-319787 A | 10/2002 |
| JP | 2006-032929 A | 2/2006 |
| JP | 2009-170634 A | 7/2009 |
| JP | 2016-94651 A | 5/2016 |
| KR | 10-2007-0085240 A | 8/2007 |

OTHER PUBLICATIONS

Sep. 29, 2021 Office Action issued in U.S. Appl. No. 16/144,604.

* cited by examiner

*Primary Examiner* — Wojciech Haske
(74) *Attorney, Agent, or Firm* — Oliff PLC

(57) ABSTRACT

A method of forming a metal magnetic film includes forming the metal magnetic film by a plating process, wherein the metal magnetic film comprises a permalloy and carbon atoms and a content of the carbon atoms is 0.3 to 3.0 at % based on a total amount of the carbon atoms and metal elements.

10 Claims, 5 Drawing Sheets

METAL MAGNETIC FILM AND MAGNETIC SHEET

CROSS-REFERENCE

This is a Continuation of application Ser. No. 16/144,604 filed Sep. 27, 2018. The disclosure of the prior application is hereby incorporated by reference herein in its entirety.

TECHNICAL FIELD

The present invention relates to a metal magnetic film and a magnetic sheet.

BACKGROUND

In recent years, with the speed-up of the operating speed of digital circuits in electronic devices and the like, malfunctions of electronic devices and the influence on human bodies by noises of electromagnetic waves and the like generated by the circuits have been aggravated. Hence, developments of noise suppression sheets in order to suppress (block) noises have advanced. For example, in Patent Literature 1, a noise suppression sheet is disclosed obtained by laminating, by using a lamination means, two or more layers of metal magnetic material layers whose single layer thickness is 10 to 80 μm, and a pressure-sensitive adhesive layer.

CITATION LIST

Patent Literature

[Patent Literature 1] Japanese Unexamined Patent Publication No. 2009-170634

SUMMARY

Technical Problem

Electronic devices mounting digital circuits and the like have, in recent years, advanced in weight reduction, thickness reduction and high integration; accompanying this, also in noise suppression sheets, the thickness reduction with a high magnetic permeability being retained is demanded. The present inventors have found that in order to reduce the thickness of a noise suppression sheet, it is effective to fabricate a metal magnetic film containing an alloy (permalloy) containing Fe and Ni, or the like by a plating process.

Meanwhile, in plating processes using a binary system such as an alloy, there arises such a problem that when the thickness of a film is made small, warping results when the film is formed.

The present invention has been achieved in consideration of such a situation, and has an object to provide a metal magnetic film capable of suppressing warping with a high magnetic permeability being retained, and a magnetic sheet comprising the metal magnetic film.

Solution to Problem

The present invention provides a metal magnetic film comprising a permalloy and a carbon atom, wherein a content of the carbon atom is 0.3 to 3.0 at % based on a total amount of the carbon atom and metal elements.

The present invention also provides a magnetic sheet comprising a support and the above metal magnetic film according to the present invention provided on the support, wherein a thickness of the metal magnetic film is 1 to 10 μm.

The support may comprise a non-magnetic metal layer, and a resin layer provided on a surface of the non-magnetic metal layer on an opposite side to the metal magnetic film.

The magnetic sheet may be a noise suppression sheet.

Advantageous Effects of Invention

According to the present invention, a metal magnetic film capable of suppressing warping with a high magnetic permeability being retained, and a magnetic sheet comprising the metal magnetic film can be provided.

DETAILED DESCRIPTION

Figure 1:
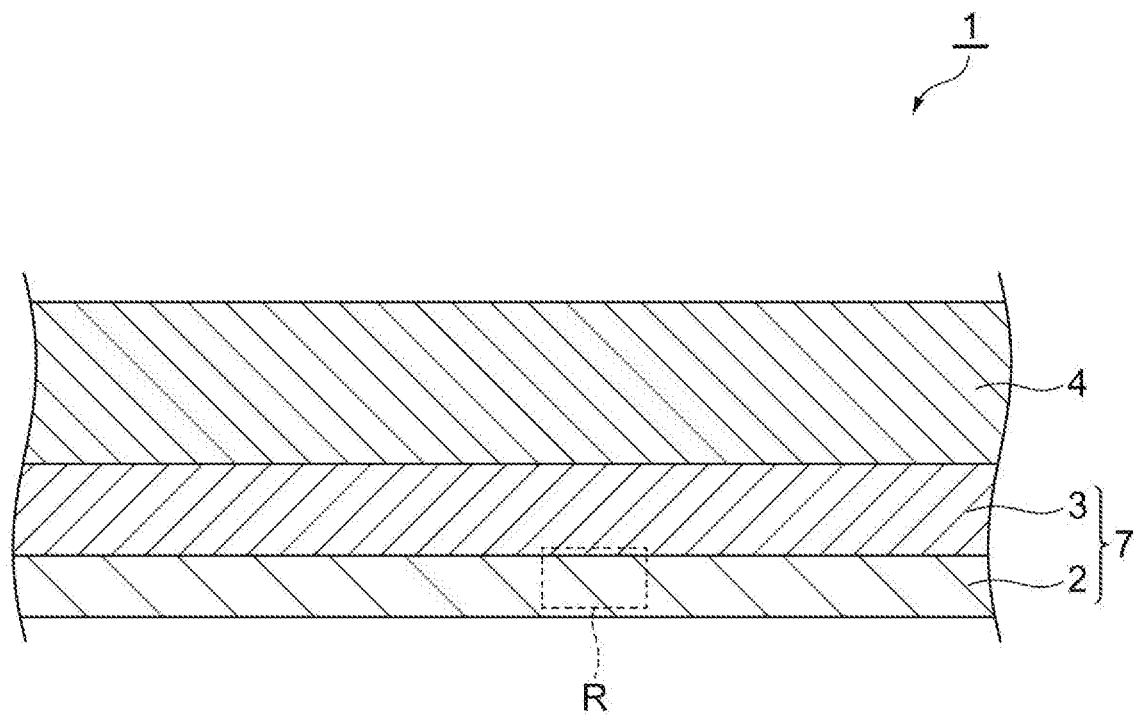
FIG. 1 is a schematic cross-sectional view illustrating one embodiment of a magnetic sheet.

Hereinafter, preferred embodiments according to the present invention will be described in detail by suitable reference to the drawings. However, the present invention is not limited to the following embodiments.

A metal magnetic film according to the present embodiment comprises a permalloy. The permalloy is an alloy containing Fe and Ni as metal elements as main components; its composition is not especially limited, but from the viewpoint of achieving a higher magnetic permeability, it is preferable to use a permalloy having a content proportion (Fe/Ni) of Fe to Ni of, in mass ratio, 10 to 50, 15 to 40 or 18 to 25.

The permalloy may contain metal elements other than Fe and Ni in the range of not remarkably impairing the advantageous effects of the present invention. Such metal elements are not especially limited, and examples thereof include Cu, Mo, Ti, Co and Mn.

The metal magnetic film contains 0.3 to 3.0 at % of carbon atoms based on the total amount of the carbon atoms and metal elements. With the concentration of the carbon atoms being 0.3 at % or more, when the metal magnetic film is fabricated by a plating process, even if the thickness of the film is made small, warping can be suppressed. On the other hand, with the concentration of the carbon atoms being 3.0 at % or less, the magnetic permeability of the metal magnetic film can be retained high, and in the case of fabricating a noise suppression sheet by using the metal magnetic film, a good noise suppressing effect can be secured. From these viewpoints, the concentration of carbon atoms is preferably 0.3 at % or more, more preferably 1.0 at % or more and still more preferably 2.0 at % or more, and preferably 3.0 at % or less, more preferably 2.5 at % or less and still more preferably 2.0 at % or less.

The concentration of carbon atoms in the metal magnetic film can be measured by using an electron probe microanalyzer (EPMA).

The thickness of the metal magnetic film may be, from the viewpoint of more improving the noise suppressing effect, 0.1 μm or more, 0.5 μm or more, 1.0 μm or more or 5 μm or more, and may be, from the viewpoint of the thickness reduction of the magnetic sheet, 20 μm or less, 15 μm or less, 10 μm or less or 7 μm or less.

The metal magnetic film can be produced, for example, by using an electroplating process or an electroless plating process. Examples of the electroplating process include a process in which a support is dipped in an electroplating bath containing ions of metals constituting a metal magnetic material containing a predetermined permalloy, and a compound to become a carbon source of the metal magnetic film, in predetermined proportions, and thereafter, water washing and the like is carried out. The electroplating bath may further contain phosphorus, boron and the like. The content of phosphorus and boron in the electroplating bath may be, for example, 5 to 50 g/L.

As the ions of metals constituting a metal magnetic material, for example, in the case of forming a permalloy, nickel ions and iron ions are used. Examples of compounds giving nickel ions include nickel sulfate, nickel chloride and nickel sulfamate, and these may be used singly or concurrently in two or more. Examples of compounds giving iron ions include iron sulfate, iron chloride and iron sulfamate, and these may be used singly or concurrently in two or more.

In an electroplating bath, the content of compounds giving ions of metals constituting a metal magnetic material can suitably be set according to properties of an objective metal magnetic film, but may be, for example, 1 to 400 g/L. In the case of using nickel sulfate hexahydrate, nickel chloride hexahydrate and iron sulfate heptahydrate as the compounds giving ions of metals, the content of nickel sulfate hexahydrate may be 100 to 400 g/L; the content of nickel chloride hexahydrate may be 1 to 20 g/L; and the content of iron sulfate heptahydrate may be 1 to 20 g/L.

Examples of the compounds to become a carbon source of the metal magnetic film include sodium saccharin, sodium laurylsulfate, citric acid, malonic acid and tartaric acid. Among these, it is preferable that the electroplating bath contain at least one selected from the group consisting of sodium saccharin and sodium laurylsulfate.

The content of the compounds to become carbon sources of the metal magnetic film in the electroplating bath is, from the viewpoint of making the concentration of carbon atoms in the metal magnetic film in a desired range, preferably 0.1 to 5.0 g/L, more preferably 0.5 to 4.0 g/L, and still more preferably 1.0 to 3.0 g/L. In the case of using sodium saccharin and sodium laurylsulfate as the compounds to become carbon sources of the metal magnetic film, the content of sodium saccharin is, for example, 0.01 to 3.0 g/L or 0.03 to 1.0 g/L; and the content of sodium laurylsulfate is, for example, 0.01 to 3.0 g/L or 0.03 to 1.0 g/L.

Examples of treatment conditions of the electroplating bath include a method of dipping for 5 to 90 min under the condition using the electroplating bath whose temperature is 35 to 50° C. and whose pH is 2 to 3 and using a current density of 0.5 to 5 A/dm$^2$. From the viewpoint of making the elemental concentration of carbon in the metal magnetic film in a desired range, the current density is preferably 0.1 to 10.0 A/dm$^2$, more preferably 0.5 to 5.0 A/dm$^2$, and still more preferably 1.0 to 2.0 A/dm$^2$; and the treatment time is preferably 3 to 300 min, more preferably 6 to 60 min, and still more preferably 15 to 30 min.

By the above-mentioned method, the metal magnetic film can be formed on the support. The magnetic sheet comprising the support and the metal magnetic film provided on the support can be also provided.

The thickness of the support, from the viewpoint of more effectively causing noises to reflect, may be 1 μm or more, 2 μm or more or 3 μm or more, and from the viewpoint of the thickness reduction of the magnetic sheet, may be 4 μm or less or 3 μm or less.

The support may comprise, for example, a non-magnetic metal layer, and a resin layer provided on the surface of the non-magnetic metal layer on the opposite side to the metal magnetic film.

FIG. 1 is a schematic cross-sectional view illustrating one embodiment of a magnetic sheet. A magnetic sheet 1 illustrated in FIG. 1 has a resin layer 2, a non-magnetic metal layer 3 and a metal magnetic film 4 in this order. In the magnetic sheet 1, the resin layer 2 and the non-magnetic metal layer 3 can also be collectively called a support 7.

A resin for forming the resin layer 2 may be, for example, a thermosetting resin or an ultraviolet curing resin. Examples of the thermosetting resin include polyester resins, epoxy resins, phenol resins and melamine resins. Examples of the ultraviolet curing resin include acrylic resins and epoxy resins.

The thickness of the resin layer 2, from the viewpoint of securing the strength of the magnetic sheet, may be 0.1 μm or more, 0.5 μm or more or 1.0 μm or more, and from the viewpoint of thickness reduction of the magnetic sheet, may be 10.0 μm or less, 5.0 μm or less or 1.0 μm or less.

It is preferable from the viewpoint of securing the adhesion with a non-magnetic metal layer 3 described later that the resin layer 2 further contain an electroless plating catalyst.

The electroless plating catalyst contained in the resin layer 2 may be a metal selected from Pd, Cu, Ni, Co, Au, Ag, Rh, Pt, In and Sn, and is preferably Pd. The electroless plating catalyst may be used singly or in a combination of two or more. Usually, the electroless plating catalyst is dispersed as electroless plating catalyst particles in the resin.

The content of the electroless plating catalyst in the resin layer 2, based on the total amount of the resin layer, may be 3% by mass or more, 4% by mass or more or 5% by mass or more, and may be 50% by mass or less, 40% by mass or less or 25% by mass or less.

Although it is preferable that the electroless plating catalyst be contained in the resin layer 2 as described above, the electroless plating catalyst may be present on the surface of the resin layer 2 on the side contacting with the non-magnetic metal layer 3.

The non-magnetic metal layer 3 is a layer containing a non-magnetic metal. The non-magnetic metal layer 3 can be formed, as described later, for example, on the above-described resin layer 2 by an electroless plating process. That is, the non-magnetic metal layer 3 can also be called a non-magnetic metal-plated layer. The non-magnetic metal layer 3 may be a layer consisting of a single non-magnetic metal plating, or may be constituted of a plurality of non-magnetic metal platings of different metal species.

Examples of the non-magnetic metal forming the non-magnetic metal layer 3 include Cu, Al, Sn and Bi, and the non-magnetic metal preferably includes at least one selected from the group consisting of Cu and Al.

The thickness of the non-magnetic metal layer 3, from the viewpoint of more effectively causing noises to reflect, may be 1 μm or more or 2 μm or more, and from the viewpoint of the thickness reduction of the magnetic sheet, may be 4 μm or less, 3 μm or less or 2 μm or less.

Figure 2:
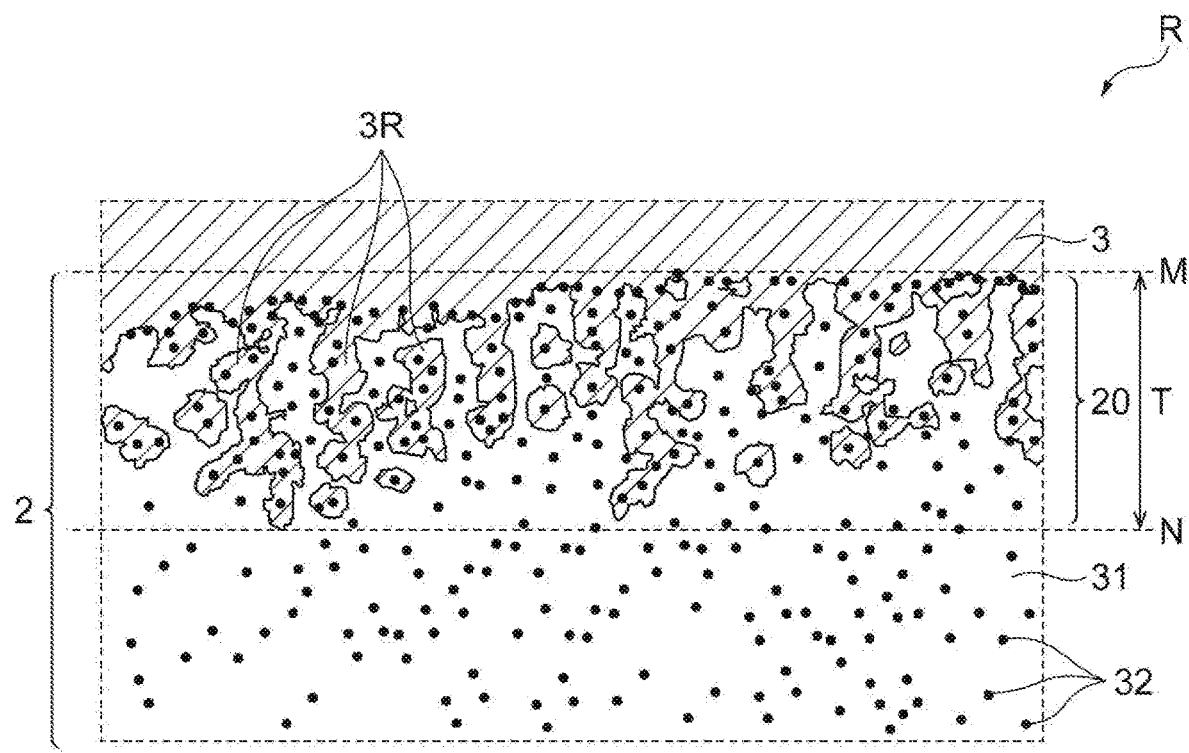
FIG. 2 is a partially enlarged view of the magnetic sheet illustrated in FIG. 1.

FIG. 2 is an enlarged view of the region R in the magnetic sheet 1 illustrated in FIG. 1. As illustrated in FIG. 2, the resin layer 2 is formed from the surface (or the upper-side boundary M) of the resin layer 2 on the non-magnetic metal layer 3 side to an inner-side thereof, and may have a mixed region 20 containing a plurality of metal particles 3R which contain the non-magnetic metals constituting the non-magnetic metal layer 3 and enter the resin layer 2. That is, the mixed region 20 contains the metal particles 3R, a resin 31 being a major component of the resin layer 2, and an electroless plating catalyst (electroless plating catalyst particles) 32. The metal particle 3R usually contains metal plating having grown with the electroless plating catalyst particles 32 as starting points. Hence, it often occurs that the electroless plating catalyst particles 32 are entrapped in the metal particle 3R. It is preferable that at least a part of the plurality of metal particles 3R continuously range across from the non-magnetic metal layer 3 to the mixed region. It can be confirmed, for example, by observation by a scanning electron microscope that the mixed region 20 has been formed.

By thus making the resin layer 2 to contain the resin 31 and the electroless plating catalyst 32, the mixed region 20 can be formed and the adhesion with the non-magnetic metal layer 3 can be enhanced.

The thickness T of the mixed region 20 is, from the viewpoint of further enhancing the adhesion with the non-magnetic metal layer 3, preferably 1 nm or more, more preferably 5 nm or more and still more preferably 10 nm or more, and preferably 200 nm or less, more preferably 100 nm or less and still more preferably 50 nm or less.

Here, the thickness T of the mixed region 20 is defined as a distance from the upper-side boundary M on the non-magnetic metal layer 3 side to the lower-side boundary N of the resin layer 2 on the opposite side to the non-magnetic metal layer 3. The upper-side boundary M and the lower-side boundary N are each a cross-section (hereinafter, called a "horizontal surface") in the perpendicular direction in the thickness direction of the resin layer 2. The upper-side boundary M is located on the non-magnetic metal layer 3 nearest side among horizontal surfaces containing the resin 31 constituting the resin layer 2. The lower-side boundary N is located on the farthest opposite side to the non-magnetic metal layer 3 among horizontal surfaces containing the metal particles 3R. The lower-side boundary N is located on the farthest opposite side to the non-magnetic metal layer 3 among horizontal surfaces containing the metal particles 3R. The upper-side boundary M and the lower-side boundary N can be determined by observation of a cross-section (hereinafter, called a "perpendicular surface") along the thickness direction of the magnetic sheet 1 by a scanning electron microscope or the like. Thicknesses T of the mixed region are determined by observing a plurality of perpendicular surfaces and an average value thereof may be regarded as a thickness T of the mixed region 20 in the magnetic sheet 1. By making the mixed region to be formed, exfoliation of the non-magnetic metal layer 3 from the resin layer 2 can effectively be suppressed.

The ratio of the thickness T of the mixed region 20 to the thickness of the resin layer 2 is preferably 0.01 or more, more preferably 0.02 or more and still more preferably 0.03 or more, and preferably 0.1 or less, more preferably 0.08 or less and still more preferably 0.05 or less.

A method for forming the non-magnetic metal layer 3 on the resin layer 2 is not especially limited, and can use, for example, an electroless plating process. Examples of the electroless plating process include a process in which the resin layer 2 is dipped in an electroless plating bath containing ions of a metal constituting a predetermined non-magnetic metal, and thereafter washed with water or the like. The electroless plating bath may further contain phosphorus, boron, iron and the like. The treatment condition of the electroless plating bath containing ions of a metal is not especially limited, but involves, for example, in the case of using an electroless plating bath containing 0.1 to 2.0% by mass of the predetermined metal ion, the treatment temperature of 70 to 90° C. and the treatment time of 10 to 120 sec. In the case where the resin layer 2 contains the electroless plating catalyst, an electroless metal plating as the non-magnetic metal layer 3 can be formed with the electroless plating catalyst as starting points.

Figure 3:
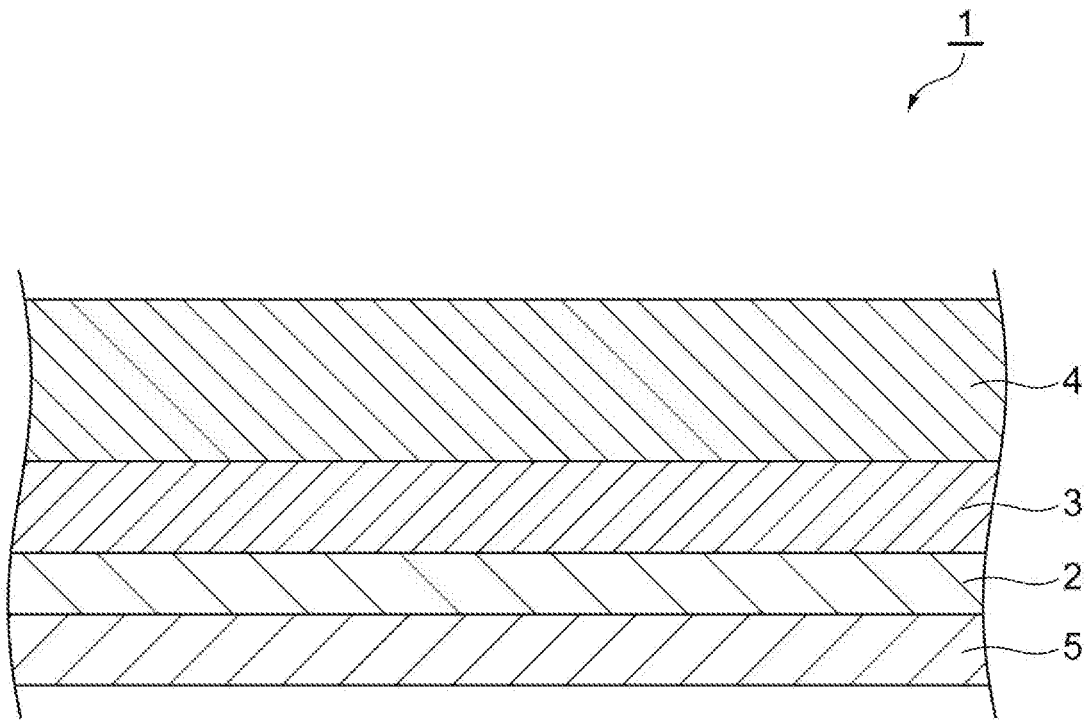
FIG. 3 is a schematic cross-sectional view illustrating another embodiment of a magnetic sheet.

FIG. 3 is a schematic cross-sectional view illustrating another embodiment of a magnetic sheet. As illustrated in FIG. 3, the magnetic sheet 1 may comprise, in addition to the resin layer 2, non-magnetic metal layer 3 and metal magnetic film 4 described above, a pressure-sensitive adhesive layer 5 provided on the major surface of the resin layer 2 on the opposite side to the non-magnetic metal layer 3. By making the magnetic sheet 1 to have the pressure-sensitive adhesive layer 5, in the case of using the magnetic sheet 1 as a noise suppression sheet, the magnetic sheet can be adhered on a desired position of an electronic component or the like and noises generated from the electronic component or the like can more effectively be suppressed.

The pressure-sensitive adhesive layer 5 is not especially limited, but can be, for example, a double coated tape. Examples of the double coated tape include acrylic pressure-sensitive adhesives, rubber-based pressure-sensitive adhesives and silicone-based pressure-sensitive adhesives.

The thickness of the pressure-sensitive adhesive layer 5 may be 1 μm or more, 5 μm or more or 10 μm or more, and 1000 μm or less, 100 μm or less or 10 μm or less.

Figure 4:
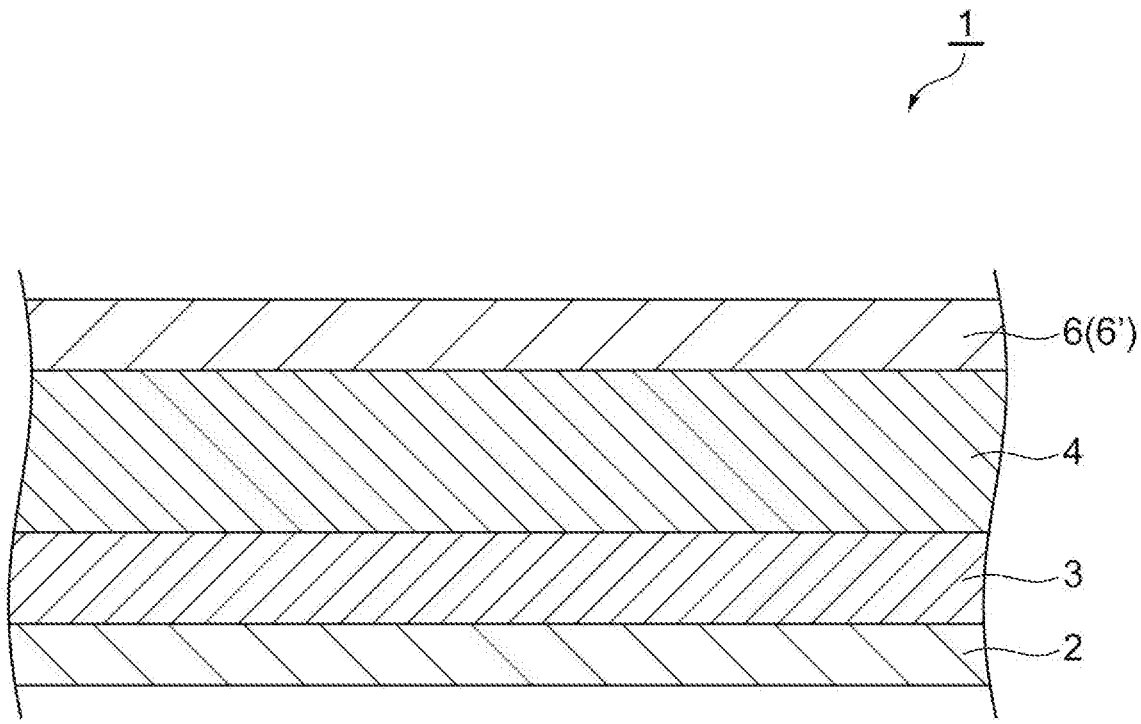
FIG. 4 is a schematic cross-sectional view illustrating another embodiment of a magnetic sheet.

FIG. 4 is a schematic cross-sectional view illustrating another embodiment of a magnetic sheet. As illustrated in FIG. 4, the magnetic sheet 1 may further comprise, in addition to the resin layer 2, non-magnetic metal layer 3 and metal magnetic film 4 described above, a rust-proofing layer 6 or an insulating layer 6' provided on the major surface of the metal magnetic film 4 on the opposite side to the non-magnetic metal layer 3. Further, the magnetic sheet may also comprise both the above-described rust-proofing layer 6 and the insulating layer 6'.

The rust-proofing layer 6 can be formed, for example, by carrying out a rust-proofing treatment using a phosphate salt, a chromate salt and the like on the major surface of the metal magnetic film on the opposite side to the non-magnetic metal layer.

The thickness of the rust-proofing layer 6 may be 0.5 μm or more, 1.0 μm or more or 2.0 μm or more, and 3.0 μm or less or 2.0 μm or less.

The insulating layer 6' may be formed of, for example, a raw material having insulation. That is, the insulating layer 6' may also be a layer functioning as the rust-proofing layer. The raw material having insulation may be an inorganic material or a resin. Examples of the inorganic material include compounds containing silicon, such as $SiO_2$ and SiN. The resin includes epoxy resins and polyimide resins.

The thickness of the insulating layer may be 0.5 μm or more, 1.0 μm or more or 2.0 μm or more, and 3.0 μm or less or 2.0 μm or less.

The thickness of the magnetic sheet according to the present embodiment, from the viewpoint of securing the strength of the magnetic sheet, may be 3 μm or more, 5 μm or more or 10 μm or more, and from the viewpoint of the thickness reduction of the magnetic sheet, may be 20 μm or less, 15 μm or less or 10 μm or less.

The magnetic sheet according to the present embodiment, by being mounted on an electronic component or the like, can absorb and suppress noises (electromagnetic waves and the like) generated from circuits and the like in the electronic component. That is, the magnetic sheet according to the present embodiment is suitably used as a noise suppression sheet and preferably used particularly as an electromagnetic wave shield.

EXAMPLES hereinafter, the present invention will be described specifically by way of Examples, but the present invention is not limited to these Examples.

Fabrication of Metal Magnetic Films

Example 1

There was prepared a resin composition containing 20% by mass of palladium particles and an isocyanate resin.

The obtained resin composition was applied and dried on a PET film (manufactured by Toyobo Co., Ltd., trade name: "Cosmoshine A4100") to thereby obtain a first laminate in which a resin layer of 1 μm in thickness was provided on the PET film. The first laminate was dipped in an electroless plating bath containing copper ions of 3.0 g/L, and subjected to an electroless plating treatment at a temperature of the plating bath of 38° C. for 45 min to thereby obtain a second laminate in which a non-magnetic metal layer (Cu layer) of 2 μm in thickness was formed. Then, the thickness of the mixed region in the second laminate was 38 nm.

The obtained second laminate was dipped in an electroplating bath having a composition of nickel sulfate hexahydrate of 200 g/L, nickel chloride hexahydrate of 10 g/L, iron sulfate heptahydrate of 10 g/L, boric acid of 30 g/L, sodium saccharin of 20 g/L and sodium laurylsulfate of 1.0 g/L and having a pH of 2.5, and subjected to an electroplating treatment under the condition of a temperature of the plating bath of 40° C. and a current density of 1 A/dm$^2$ for 60 min to thereby fabricate a magnetic sheet (thickness: 8 μm) in which a metal magnetic film (a film containing a permalloy) of 5 μm in thickness was formed. The proportion (Fe/Ni) of Fe to Ni contained in the permalloy was 21.5 in mass ratio.

Example 2

A magnetic sheet (thickness: 8 μm) in which a metal magnetic film (a film containing a permalloy) of 5 μm in thickness was formed was fabricated by the same operation as in Example 1, except for making the content of sodium saccharin to be 7 g/L and the content of sodium laurylsulfate to be 0.3 g/L in the composition of the electroplating bath. The proportion (Fe/Ni) of Fe to Ni contained in the permalloy was 20.6 in mass ratio.

Example 3

A magnetic sheet (thickness: 8 μm) in which a metal magnetic film (a film containing a permalloy) of 5 μm in thickness was formed was fabricated by the same operation as in Example 1, except for making the content of sodium saccharin to be 40 g/L and the content of sodium laurylsulfate to be 2.0 g/L in the composition of the electroplating bath. The proportion (Fe/Ni) of Fe to Ni contained in the permalloy was 22.0 in mass ratio.

Example 4

A magnetic sheet (thickness: 8 μm) in which a metal magnetic film (a film containing a permalloy) of 5 μm in thickness was formed was fabricated by the same operation as in Example 1, except for making the content of sodium saccharin to be 60 g/L and the content of sodium laurylsulfate to be 3.0 g/L in the composition of the electroplating bath. The proportion (Fe/Ni) of Fe to Ni contained in the permalloy was 21.8 in mass ratio.

Comparative Example 1

A magnetic sheet (thickness: 8 μm) in which a metal magnetic film (a film containing a permalloy) of 5 μm in thickness was formed was fabricated by the same operation as in Example 1, except for making no sodium saccharin nor sodium laurylsulfate to be contained in the electroplating bath. The proportion (Fe/Ni) of Fe to Ni contained in the permalloy was 21.2 in mass ratio.

Comparative Example 2

A magnetic sheet (thickness: 8 μm) in which a metal magnetic film (a film containing a permalloy) of 5 μm in thickness was formed was fabricated by the same operation as in Example 1, except for making the content of sodium saccharin to be 2.0 g/L and the content of sodium laurylsulfate to be 0.1 g/L in the electroplating bath. The proportion (Fe/Ni) of Fe to Ni contained in the permalloy was 20.8 in mass ratio.

Comparative Example 3

A magnetic sheet (thickness: 8 μm) in which a metal magnetic film (a film containing a permalloy) of 5 μm in thickness was formed was fabricated by the same operation as in Example 1, except for making the content of sodium saccharin to be 100.0 g/L and the content of sodium laurylsulfate to be 5.0 g/L in the electroplating bath. The proportion (Fe/Ni) of Fe to Ni contained in the permalloy was 20.9 in mass ratio.

[Evaluation of the Magnetic Sheets]
(Measurement of the Carbon Content in the Metal Magnetic Films)

The content of carbon was measured by using an electron probe microanalyzer (EPMA), and measured under the condition of an irradiation current of 1.0E-7 A, an accelerating voltage of 15 kV and a beam diameter of 1 μm. The results are shown in Table 1.

(Measurement of the Magnetic Permeability)

The magnetic sheets obtained in Examples 1 to 4 and Comparative Examples 1 to 3 were each processed into a ring shape, and the frequency characteristic of the magnetism rate thereof was measured by using an impedance analyzer. The frequency characteristic was checked and the magnetic permeability at 1 MHz was read. The results are shown in Table 1.

(Bending Test)

The magnetic sheets obtained in Examples 1 to 4 were each subjected to the following bending test, and whether exfoliation between layers occurred was checked.

Figure 5:
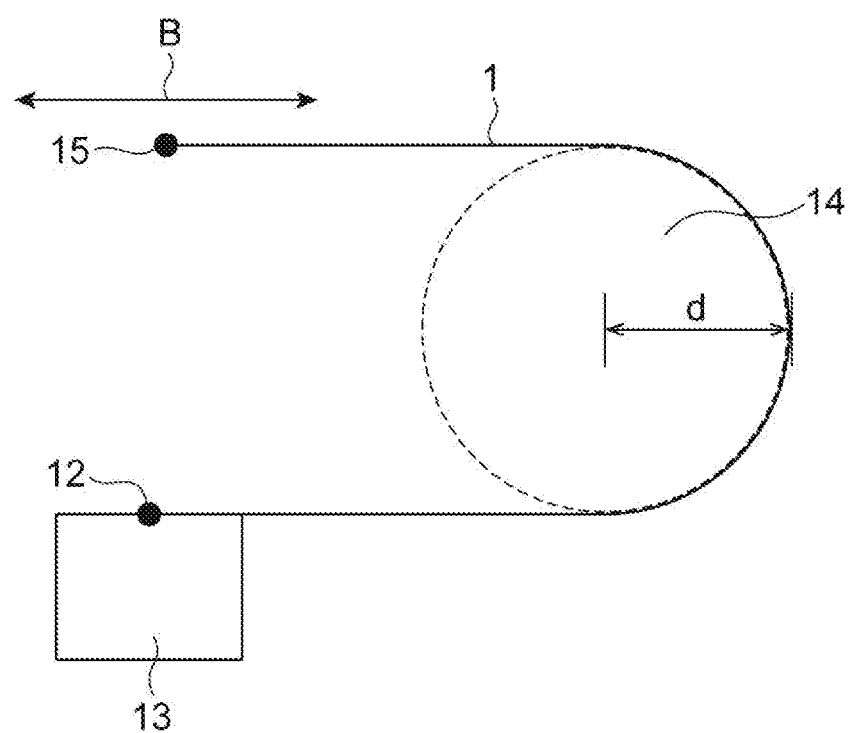
FIG. 5 is a schematic view of a bending resistance tester.

A sample of 150 mm in length and 50 mm in width of the each sheet was prepared. The sample was subjected to a bending test using a bending resistance tester illustrated in FIG. 5 and according to JIS C5016. That is, a magnetic sheet 1 was disposed so that with one end 12 of the magnetic sheet 1 being fixed to a fixing section 13, the magnetic sheet 1 was bent along on a circular peripheral surface (radius of curvature d: 5 mm) of a bending section 14. Thereafter, one end 15 of the magnetic sheet 1 on the opposite side to the one end 12 was reciprocated along directions indicated by the arrow B. The one end 15 was repeatedly reciprocated for 1 minute with the moving distance of the reciprocation being set at 30 mm and the period of the reciprocation being set at 150 times/min. A cross-section of the sample after the bending test was observed by a scanning electron microscope and whether exfoliation between layers occurred was checked.

TABLE 1

|  | Carbon Content (at %) | Magnetic Permeability (1 MHz) |
|---|---|---|
| Example 1 | 1 | 530 |
| Example 2 | 0.3 | 543 |
| Example 3 | 2 | 236 |
| Example 4 | 3 | 183 |
| Comparative Example 1 | 0 | —*1 |
| Comparative Example 2 | 0.1 | —*1 |
| Comparative Example 3 | 5 | 90 |

*1 The sheet rolled during the formation of the metal magnetic film, and the measurement could not be made.

REFERENCE SIGNS LIST

1 . . . MAGNETIC SHEET, 2 . . . RESIN LAYER, 3 . . . NON-MAGNETIC METAL LAYER, 3R . . . METAL PARTICLE, 4 . . . METAL MAGNETIC FILM, 5 . . . PRESSURE-SENSITIVE ADHESIVE LAYER, 6 . . . RUST-PROOFING LAYER, 6' . . . INSULATING LAYER, 7 . . . SUPPORT, 20 . . . MIXED REGION, 31 . . . RESIN, 32 . . . ELECTROLESS PLATING CATALYST (ELECTROLESS PLATING CATALYST PARTICLE)

What is claimed is:

1. A method of forming a metal magnetic film, comprising:
    forming the metal magnetic film by a plating process, wherein:
    the metal magnetic film comprises a permalloy and carbon atoms;
    a content of the carbon atoms is 1.0 to 3.0 at % based on a total amount of the carbon atoms and metal elements; and
    a thickness of the metal magnetic film is 1 to 10 μm.

2. The method according to claim 1, wherein:
    the metal magnetic film is formed on a support by an electroplating process so as to produce a magnetic sheet; and
    the electroplating process comprises dipping the support in an electroplating bath containing compounds that provide ions of the metal elements and a compound that is a carbon source.

3. The method according to claim 2, wherein the support comprises a non-magnetic metal layer, and a resin layer provided on a surface of the non-magnetic metal layer on an opposite side to the metal magnetic film.

4. The method according to claim 2, wherein the magnetic sheet is a noise suppression sheet.

5. The method according to claim 2, wherein a content of the compounds that provide ions of the metal elements in the electroplating bath is 1 to 400 g/L.

6. The method according to claim 2, wherein a content of the compound that is a carbon source in the electroplating bath is 0.1 to 5.0 g/L.

7. The method according to claim 2, wherein:
    the electroplating process uses a current density of 0.5 to 5 A/dm$^2$;
    the support is dipped in the electroplating bath for 5 to 90 minutes; and
    the electroplating bath has a temperature of 35 to 50° C. and a pH of 2 to 3.

8. The method according to claim 2, wherein the support comprises a pressure-sensitive adhesive layer, a non-magnetic metal layer, and a resin layer provided on a surface of the non-magnetic metal layer on an opposite side to the metal magnetic film.

9. The method according to claim 1, wherein the permalloy contains iron (Fe) and nickel (Ni) in a mass ratio of Fe to Ni (Fe/Ni) that is from 15 to 40.

10. The method according to claim 1, wherein the permalloy contains iron (Fe) and nickel (Ni) in a mass ratio of Fe to Ni (Fe/Ni) that is from 18 to 25.

* * * * *